United States Patent [19]
Min et al.

[11] Patent Number: 5,818,212
[45] Date of Patent: Oct. 6, 1998

[54] REFERENCE VOLTAGE GENERATING CIRCUIT OF A SEMICONDUCTOR MEMORY DEVICE

[75] Inventors: Dong-Seon Min; Dong-Soo Jeon, both of Seoul, Rep. of Korea

[73] Assignee: SamSung Electronics Co., Ltd., Kyungki-do, Rep. of Korea

[21] Appl. No.: 683,717

[22] Filed: Apr. 11, 1991

[30] Foreign Application Priority Data

Nov. 30, 1990 [KR] Rep. of Korea ................ 1990-19590

[51] Int. Cl.⁶ .................................................. G05F 3/16
[52] U.S. Cl. ............................................ 323/314; 327/538
[58] Field of Search ........................... 307/296.6, 296.8; 323/313, 314, 315, 293, 907; 327/538, 543

[56] References Cited

U.S. PATENT DOCUMENTS

| | | | |
|---|---|---|---|
| 4,295,088 | 10/1981 | Malchow | 323/313 |
| 4,527,213 | 7/1985 | Ariizumi | 361/56 |
| 4,788,455 | 11/1988 | Mori et al. | 307/297 |
| 4,833,342 | 5/1989 | Kirgu et al. | 307/296.1 |
| 4,906,914 | 3/1990 | Ohsawa | 323/314 |
| 5,001,414 | 3/1991 | Brambilla et al. | 323/313 |
| 5,023,543 | 6/1991 | Tse | 323/314 |
| 5,028,975 | 7/1991 | Nagasawa et al. | 357/41 |

Primary Examiner—Adolf Berhane
Attorney, Agent, or Firm—Robert E. Bushnell, Esq.

[57] ABSTRACT

A reference voltage generating circuit of a semiconductor memory device including a reference voltage circuit for producing a constant voltage, a differential amplifier for receiving the constant voltage as one input, a MOS transistor with the gate connected to the output of the differential amplifier and with the channel connected between a power supply terminal and a reference voltage output terminal and a voltage divider with an input and output respectively connected to the reference voltage output terminal and the other input of the differential amplifier, is disclosed. The voltage divider has a MOS transistor connected between the reference voltage output terminal and the output and a resistor connected between the output and ground voltage terminal, the MOS transistor being operated in saturation region. The voltage of the reference voltage output terminal is proportional to the constant voltage and inversely proportional to the resistance of the load means, to thereby keep a stable voltage regardless of the variation of the temperature and in manufacturing.

23 Claims, 7 Drawing Sheets

REFERENCE VOLTAGE GENERATING CIRCUIT OF A SEMICONDUCTOR MEMORY DEVICE

TECHNICAL BACKGROUND

The present invention relates to a reference voltage generating circuit of a semiconductor memory device.

It is important to induce a stable internal operating voltage in a semiconductor memory device for insuring reliability. In order to make the memory device stably work without being affected by variation of external power supply voltage, a reference voltage generating circuit is required to provide a constant voltage. However, such a reference voltage generating circuit has itself unstabilizing factors mainly caused by variation of temperature, procedural conditions, etc.

Referring to FIG. 1, a conventional reference voltage generating circuit comprises a resistor connected between a power supply terminal Vcc and the node 10 of reference voltage $V_{ref1}$, and a plurality of diode-connected PMOS transistors T1, T2, ..., TN connected in series between the node 10 and ground voltage terminal Vss. The level of the reference voltage $V_{ref1}$ is the sum of the threshold voltages of the plurality of PMOS transistors, i.e. $nV_{tp}$. The reference voltage $V_{ref1}$ is proportional to the threshold voltage $V_{tp}$ of the PMOS transistor that may vary with the temperature and procedural conditions.

Some of the factors that may cause the threshold voltage of the MOS transistor to be changed are the concentration of the impurities contained in the substrate during manufacturing process, and increased temperature during operation that may cause the increase in minor carriers in the channel region, so as to lower the threshold voltage. Hence, The circuit of FIG. 1 is very susceptible to the variation of the temperature and the manufacture.

Referring to FIG. 2, another embodiment of the conventional reference voltage generating circuit comprises the reference voltage generating circuit 20 of FIG. 1, a differential amplifier 30, voltage divider 40 and output PMOS transistor T23.

The output 21 of the reference voltage generating circuit 20 and the output 41 of the voltage divider 40 are both inputs of to the differential amplifier 30 of single-ended N-channel input type, whereas the output 31 of the differential amplifier 30 is applied to the gate of the PMOS transistor T23 that controls the passage of the power supply voltage Vcc so as to increase or decrease the level of the reference voltage $V_{ref2}$ according to the level of the voltage applied to the gate. Namely, in the circuit of FIG. 2 the present level of the reference voltage is detected by the voltage divider 40 and the differential amplifier 30 compares the detected reference voltage level with a given voltage level 21, so that if the detected voltage level is lower than the given level, the PMOS transistor T23 is turned on to charge the node 42 of the reference voltage $V_{ref2}$, or otherwise the node 42 is blocked from being charged, thus keeping the reference voltage $V_{ref2}$ constant.

Here, since the voltage level of the output 21 of the reference voltage generating circuit 20 is $2V_{tp}$, and the output 41 of the voltage divider 40 is proportional to R21/(R21+R22). Thus the reference voltage $V_{ref2}$ is expressed by the following Eq. (1).

$$V_{ref2}=2V_{tp}/R21/(R21+R22))=2V_{tp}(1+R22/R21) \quad (1)$$

As seen from the Eq. (1), the circuit of FIG. 2 has the advantage that the reference voltage $V_{ref2}$ may be controlled by the rate of the resistors R21 and R22. However, since the reference voltage $V_{ref2}$ is proportional to the threshold voltages $V_{tp}$ of the PMOS transistors (or NMOS transistors may be used) T1 and T2, it is impossible overcome instability caused by variation in temperature and in manufacturing conditions.

In order to overcome instability of the reference voltage caused by the variation in the temperature and in manufacturing conditions, a further embodiment of the conventional reference voltage generating circuit is shown in FIG. 3. This circuit introduces bipolar transistors instead of MOS transistors, forming a band gap reference (BGR) voltage generating circuit, wherein the reference voltage $V_{ref3}$ is given by the following Eq. (2).

$$V_{ref3}=V_{BE}+(R33/R34)\cdot(kT/q)\cdot ln(R33/R32) \quad (2)$$

Wherein $V_{BE}$ is the base-emitter voltage of the NPN bipolar transistor Q3, q the charge of an electron, k the Boltzmann constant, and T the absolute temperature ( K).

As seen from Eq. (2), the resistors R32, R33 and R34 whose values are already fixed do not affect the level of the reference voltage $V_{ref3}$, but $V_{BE}$ and kT/q may cause variation thereof.

The base-emitter voltage $V_{BE}$ of the NPN bipolar transistor Q3 is lowered as the temperature is increased. The reason is that the number of minority carriers in Q3 (electrons because the base is P-type) increases with the increase in temperature so that the electrons injected from the emitter do not contribute to the base current. Besides, kT/q is proportional to temperature.

Thus, the reference voltage generating circuit of FIG. 3 improves stability of the reference voltage $V_{ref3}$ because $V_{BE}$ and kT/q complementarily vary with temperature. However, the BGR voltage generating circuit of FIG. 3 employs bipolar transistors, and therefore a masking process is additionally required during manufacturing. Moreover, since the active elements are comprised of bipolar transistors, the power consumption is greater than in the circuits of FIGS. 1 and 2.

SUMMARY OF THE INVENTION

The object of the present invention is to provide a reference voltage generating circuit for a semiconductor memory that is not overly susceptible to variations in temperature and the manufacturing conditions, has a low power consumption, and does not require additional processing steps.

According to the present invention, a reference voltage generating circuit of a semiconductor memory device comprises a reference voltage circuit for producing a constant voltage, a differential amplifier for receiving the constant voltage as one input, a MOS transistor with a gate connected to the output of the differential amplifier and with a channel connected between a power supply terminal and a reference voltage output terminal and a voltage divider with an input and output respectively connected to the reference voltage output terminal and the other input of the differential amplifier, wherein the voltage divider comprises a MOS-type load means connected between the reference voltage output terminal and the output and a resistor connected between the output and ground voltage terminal, the MOS-type load means being operated in saturation region.

The present invention will now be described more specifically with reference to the drawings attached only by way of example.

BRIEF DESCRIPTION OF THE ATTACHED DRAWINGS

DETAILED DESCRIPTION OF A PREFERRED EMBODIMENTS

Figure 4:
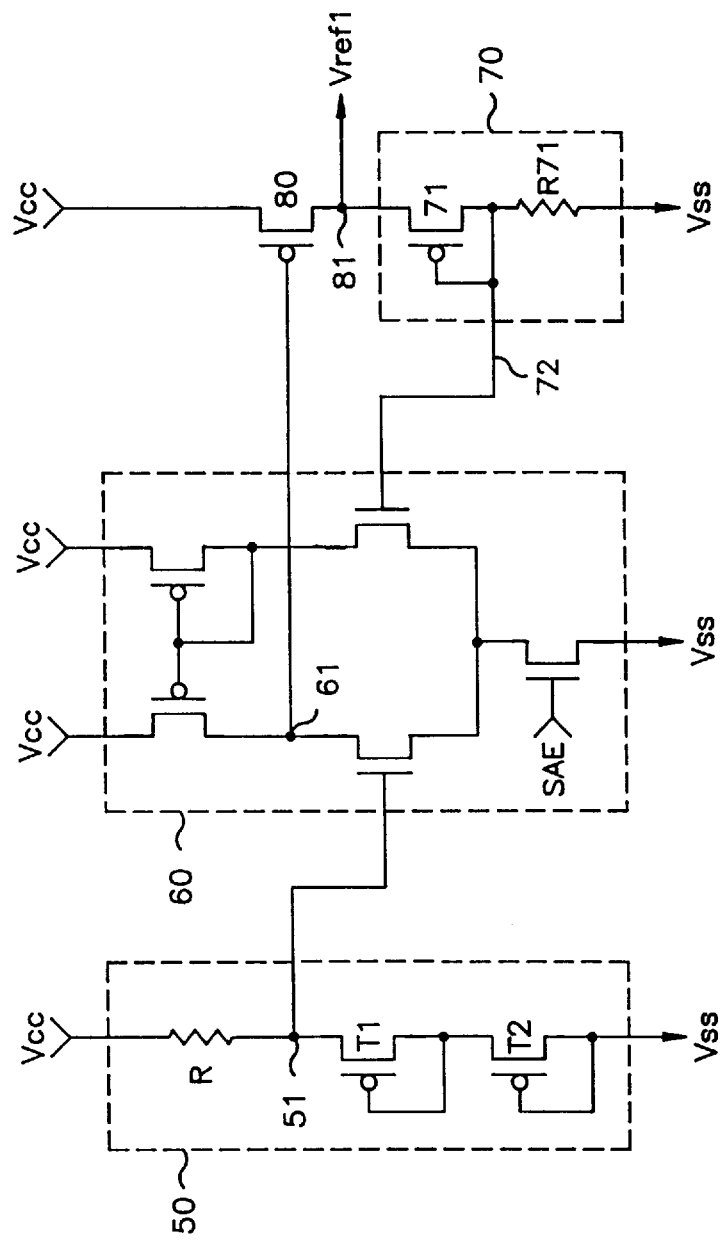
FIG. 4 is a first embodiment of the inventive circuit.

Referring to FIG. 4, a reference voltage generating circuit comprises a reference voltage circuit 50, a differential amplifier 60, a voltage divider 70, a reference voltage output node 81 and a output drive PMOS transistor 80 with a channel connected between the reference voltage output node 81 and a power supply terminal Vcc and with a gate connected to the output 61 of the differential amplifier 60.

Figure 2:
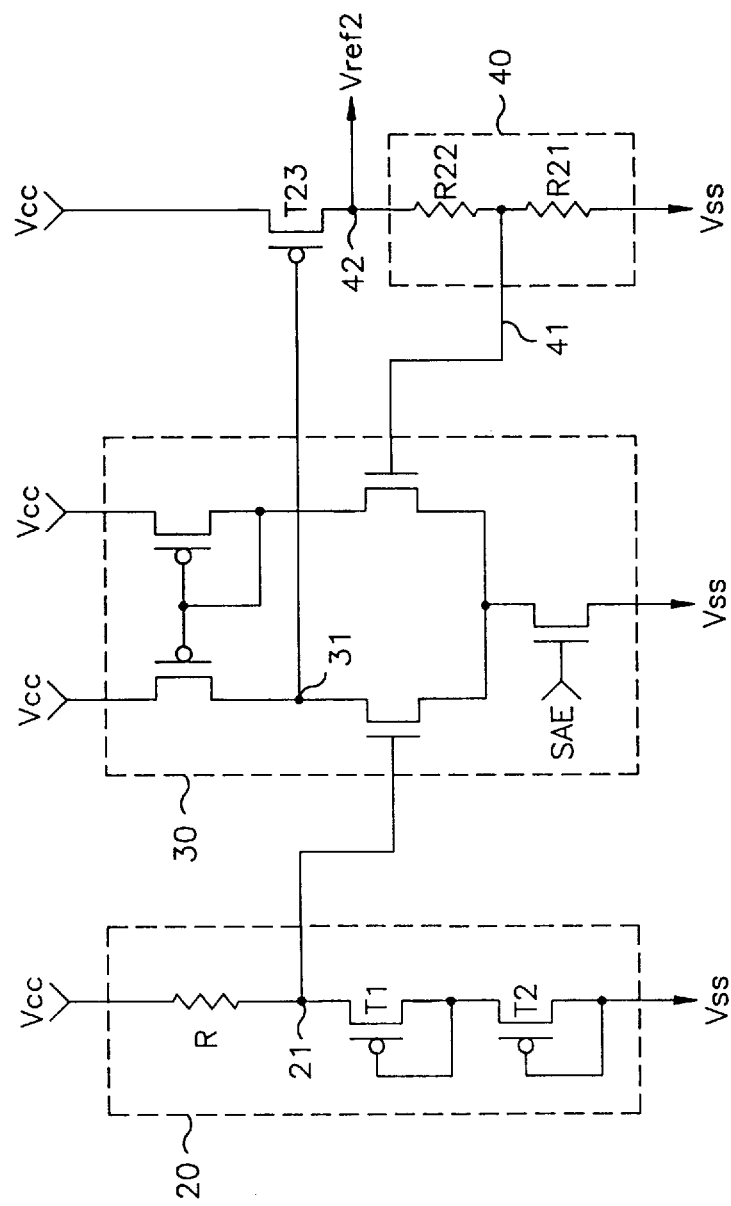
FIG. 2 is a schematic diagram of another conventional reference voltage generating circuit.
Figure 3:
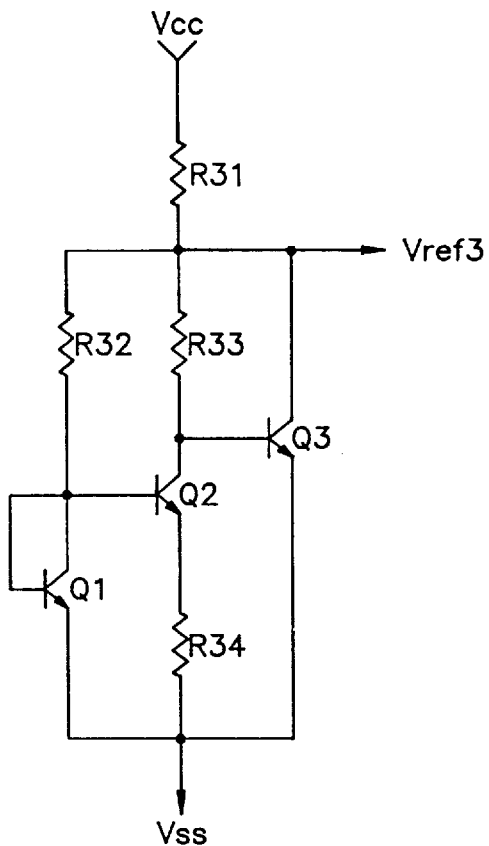
FIG. 3 is a schematic diagram of another conventional reference voltage generating circuit.

The reference voltage circuit 50, the differential amplifier 60 and the output drive PMOS transistor are the same as those of the circuit of FIG. 2. In the differential amplifier 60, a signal, SAE, is applied to a gate of an NMOS transistor connected to ground voltage terminal Vss so as to operate the differential amplifier.

The voltage divider 70, that is the essential part of the inventive circuit, comprises a PMOS transistor 71 with a channel connected between the reference voltage output node 81 and a output 72 of the voltage divider 70 and with a gate connected to the output 72 and a resistor R71 connected between the output 72 and ground voltage terminal Vss. The output 72 and the output node 51 of the reference voltage circuit 50 serve the two inputs of the differential amplifier 60.

Here, the resistor R71 may be polycrystalline silicon with a thickness of 4000–6000 Å or a diffusion region in a semiconductor substrate. The source of the PMOS transistor 71 may be connected to the substrate.

Figure 5:
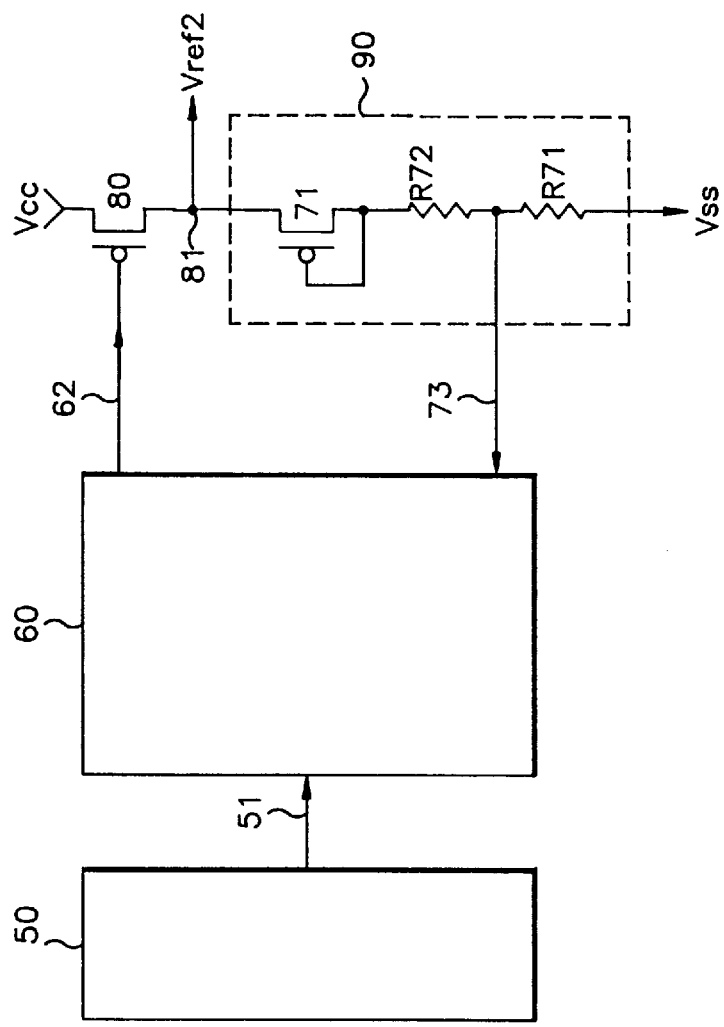
FIG. 5 is a second embodiment of the inventive circuit.

Referring to FIG. 5 for illustrating a second embodiment of the present invention, the reference voltage generating circuit also comprises the reference voltage circuit 50, the differential amplifier 60 and the output drive PMOS transistor 80, as in the case of FIG. 4. However, a voltage divider 90 differs from that of FIG. 4. Namely, an additional resistor R72 is provided between the PMOS transistor 71 connected to the reference voltage output node 81 and the resistor R71 connected to the ground voltage terminal. The output 73 is connected between the two resistors R71 and R72.

In FIGS. 4 and 5, the PMOS transistor 71 used in the voltage dividers, 60 and 90, has a commonly connected gate and drain, working in a saturation region so as to serve a resistive element.

Figure 6A:
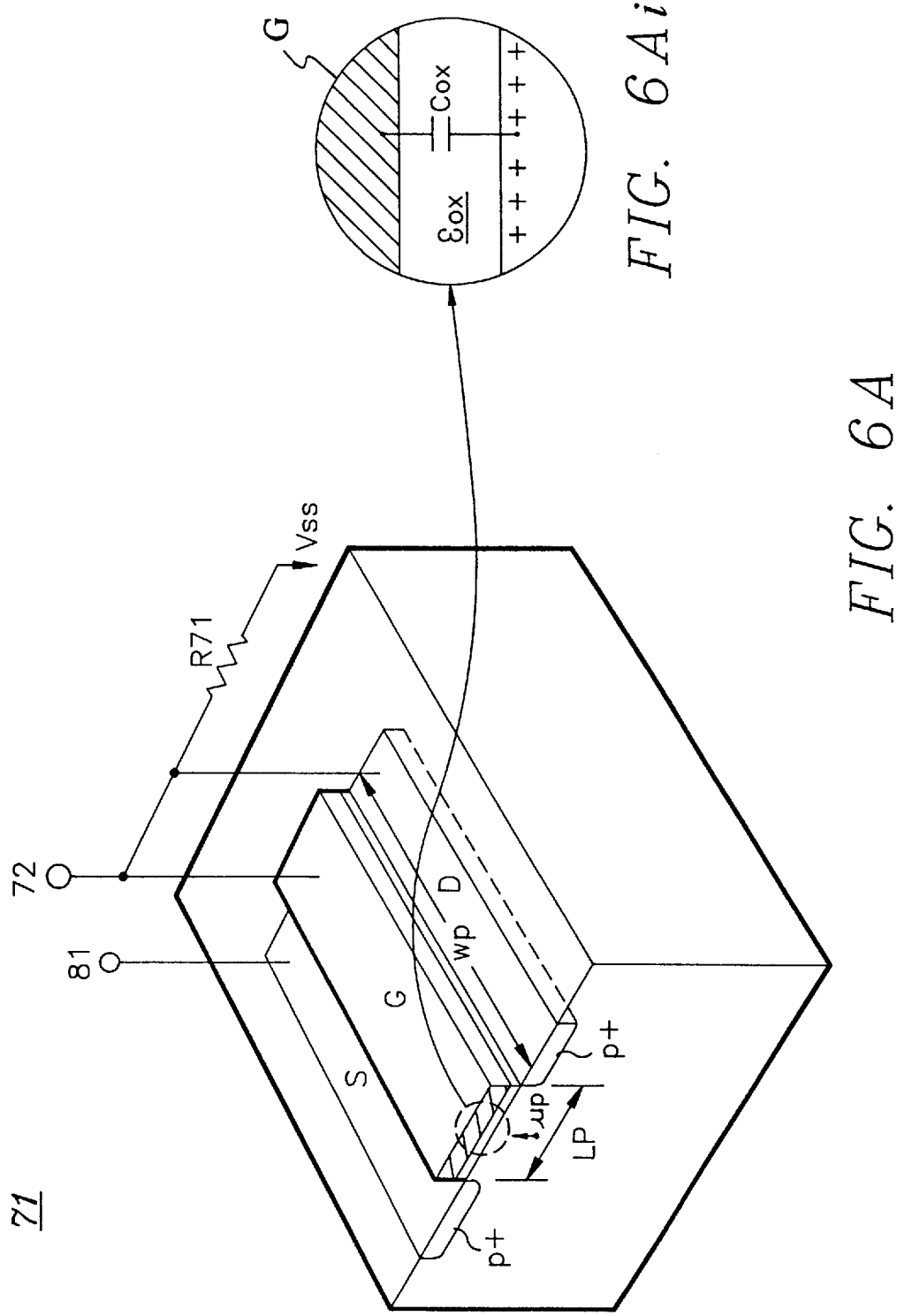
FIG. 6A shows a detailed structure of a PMOS transistor for illustrating the characteristics of a voltage divider according to the present invention.
Figure 6B:
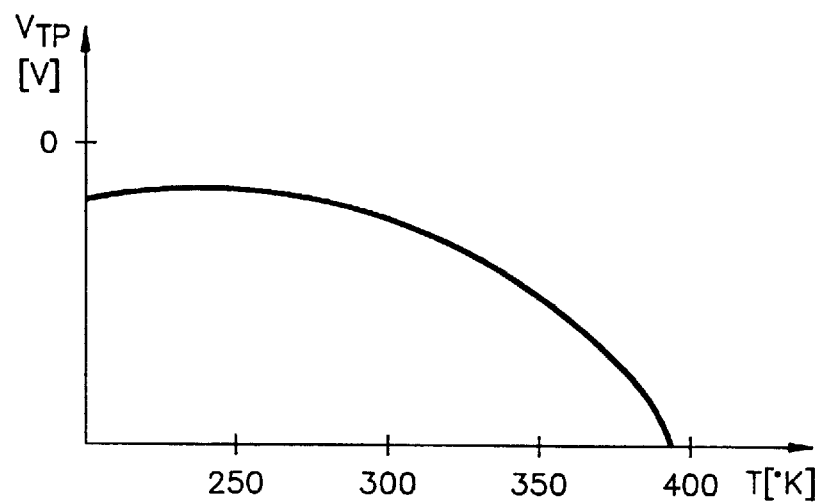
FIG. 6B is a graph for illustrating the relationship between temperature and threshold voltage.
Figure 6C:
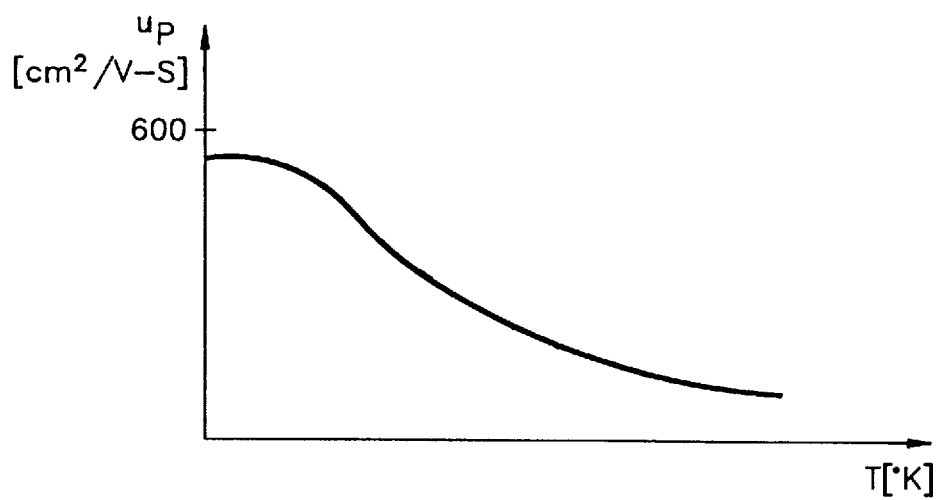
FIG. 6C is a graph for illustrating temperature and the mobility of holes.

FIGS. 6A, 6B and 6C respectively illustrate a detailed structure of the PMOS transistor 71 used in the embodiments of FIGS. 4 and 5, a graph of the variations of the threshold voltage of the PMOS transistor 71 with temperature variation, and the relationship between the hole mobility of the PMOS transistor 71 and temperature variation.

Hereinafter, the operation of the inventive circuit will be described specifically.

Referring to FIG. 4, the reference voltage circuit 50 produces an output 51 of $2V_{tp}$ ($V_{tp}$:threshold voltage of PMOS transistor) by means of the two diode-connected PMOS transistors T1, T2.

On the other hand, the voltage divider 70 produces the divided output 72 obtained by means of the resistor $R_p$ of the PMOS transistor 71 and the resistor R71.

Because the PMOS transistor 71 works in the saturation region, the drain-source current Ids is given by the following Eq. (3).

$$I_{ds}=((\mu_p C_{ox} W_p)/2L_p)*(V_g - V_{tp})^2 \qquad (3)$$

Wherein $\mu_p$ is the hole mobility, $C_{ox}$ the capacitance of the gate oxide, $W_p$ the channel width, $L_p$ the channel length, $V_g$ the gate voltage, and $V_{tp}$ the threshold voltage.

In this case, since the gate of the PMOS transistor 71 is connected to the drain, it is considered that the gate voltage $V_g$ is the drain voltage $V_d$ that is the opposite ($-V_{tp}$) of the threshold voltage $V_{tp}$.

Hence, Eq. (3) may be transformed as follows:

$$\begin{aligned}
I_{ds} &= ((\mu_p C_{ox} W_p)/2L_p)*(V_g - V_{tp})^2 & (3)\\
&= ((\mu_p C_{ox} W_p)/2L_p)*(-V_{tp} - V_{tp})^2 & (3)\\
&= ((\mu_p C_{ox} W_p)/2L_p)*4V_{tp}^2 &\\
&= ((\mu_p C_{ox} W_p 2V_{tp})/L_p)*V_{tp} & (4)
\end{aligned}$$

The fraction of Eq. (4) represents the inverse of the value of the resistor $R_p$ of the PMOS transistor 71. Hence, the value of the resistor $R_p$ is given by the following Eq. (5):

$$R_p = L_p/(\mu_p C_{ox} W_p 2V_{tp}) \qquad (5)$$

On the other hand, the outputted reference voltage $V_{ref1}$ may be analyzed in the same manner as in FIG. 2, and therefore $$V_{ref1}=2V_t(1+Rp/R71) \qquad (6)$$

Making a substitution of Eq. (5) in Eq. (6), $V_{ref1}$ is defined as follows:

$$V_{ref1}=2V_{tp}+(L_p/(\mu_p C_{ox} W_p R71)) \qquad (7)$$

As seen from Eq. (7), the reference voltage $V_{ref1}$ is determined by the threshold voltage $V_{tp}$ and the hole mobility (electron mobility in the case of employing NMOS transistor). Referring to FIG. 6A, the charge capacitance $C_{ox}$ of the gate oxide layer in Eq. (7) is fixed by the thickness, dielectric constant $E_{ox}$, etc. of the gate oxide layer determined in the manufacturing process, and the width $W_p$ and length $L_p$ of the channel are structurally fixed, so that they may be regarded as constants.

Figure 1:
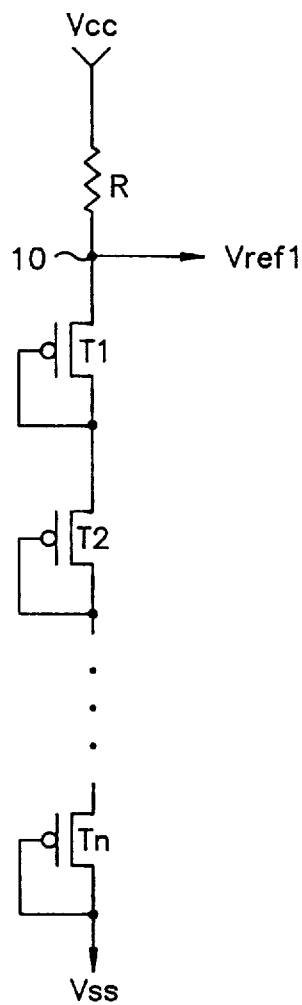
FIG. 1 is a schematic diagram of a conventional reference voltage generating circuit.

However, the threshold voltage $V_{tp}$, previously mentioned with reference to FIG. 1, is lowered with the increase of temperature as shown in FIG. 6B, which is well known in this technical field. On the other hand, the hole mobility $\mu_p$ is inversely proportional to temperature, i.e., in the ratio of $1/T^m$, as shown in FIG. 6C. Here, $1/T^m$ is determined by the type of the semiconductor substrate, i.e., 0.25 in the case of a silicon semiconductor substrate. Practically the electron mobility is affected by the lattice scattering associated with the temperature variation and the impurity scattering. Hence, when the temperature is increased, the electron mobility is decreased by the lattice scattering as shown in FIG. 6C.

Thus, the threshold voltage $V_{tp}$ in Eq. (7) is lowered with the increase of the temperature, but the hole mobility $\mu_p$ is decreased because of increase of $T^m$ with the increase of the temperature, so that the reference voltage $V_{ref1}$ is kept stable regardless of the temperature variation due to the complementary relationship of the two.

The reference voltage generating circuit of FIG. 5 has an additional resistor R72 formed of a thin film polycrystalline silicon, and its operation has the substantially same effect as that of the circuit of FIG. 4. The reference voltage $V_{ref2}$ in FIG. 5 is $V_{ref2}=2V_{tp}(1+R72/R71)+L_p/(\mu_p C_{ox} W_p R71)$.

Of course, even if the threshold voltage $V_{tp}$ varies with the impurity concentration, etc. formed in the substrate during the manufacturing process, the reference voltage is not considerably affected thereby due to the above described complementary relationship between the threshold voltage and mobility.

It will be readily appreciated by those who have ordinary knowledge in this technical field that other kinds of elements may be employed to obtain the same effect, instead of the load PMOS transistor described above.

Thus the reference voltage generating circuit according to the present invention keeps the reference voltage stable by means of complementing the adverse factors due to the temperature and manufacturing conditions.

Further, the means for complementing the adverse factors is achieved by the MOS element, so that the power consumption is decreased and the conventional manufacturing process may be employed to produce the inventive circuit.

What is claimed is:

1. A reference voltage generator for use in a semiconductor memory device, comprising
    a reference voltage circuit for producing an internal reference voltage;
    a differential amplifier for generating a difference signal in response to said internal reference voltage received at a first input terminal and a divided voltage received at a second input terminal;
    a first MOS transistor having a first gate receiving said difference signal and having a first channel connected between a first voltage terminal and a reference voltage output terminal; and
    voltage dividing means for generating said divided voltage at a voltage divider output terminal in response a second voltage and a voltage at said reference voltage output terminal, said voltage dividing means comprising MOS-type load means connected between said reference voltage output terminal and said voltage divider output terminal and resistive means connected between said voltage divider output terminal and said second voltage, said MOS-type load means being operated in a saturation region.

2. A reference voltage generator as claimed in claim 1, wherein said resistive means comprises polycrystalline silicon having a thickness less than approximately 6000 Å.

3. A reference voltage generator as claimed in claim 1, wherein said MOS-type load means comprises a second MOS transistor having a second channel and a second gate, a first end of said second channel being connected to said reference voltage output terminal, said second gate and a second end of said second channel being commonly connected to said voltage divider output terminal.

4. A reference voltage generator as claimed in claim 3, wherein one of said first end of said second channel and said second end of said second channel is connected to a semiconductor substrate.

5. A reference voltage generator for use in a semiconductor memory device, said reference voltage generator comprising:
    a reference voltage circuit for producing an internal reference voltage;
    a differential amplifier for generating a difference signal in response to said internal reference voltage received at a first input terminal and a divided voltage received at a second input terminal;
    a MOS transistor having a gate receiving said difference signal and having a channel connected between a first voltage and a reference voltage output terminal;
    voltage dividing means for generating said divided voltage at a voltage divider output terminal in response to a second voltage and a voltage at said reference voltage output terminal, said voltage dividing means comprising MOS-type load means and a first resistor connected in series between said reference voltage output terminal and said voltage divider output terminal, and a second resistor connected between said voltage divider output terminal and said second voltage, said MOS-type load means being operated in saturation region.

6. A reference voltage generator as claimed in claim 5, wherein said first resistor is a diffusion region of a thickness less than approximately 6000 Å formed in a semiconductor substrate.

7. A reference voltage generator for a semiconductor memory device having a differential amplifier, said reference voltage generator comprising:
    voltage circuit means for providing a first input term of said differential amplifier with an internal reference voltage;
    a reference voltage output terminal having an output reference voltage; and
    voltage dividing means for generating a divided voltage in response to said output reference voltage, said voltage dividing means comprising a metal oxide semiconductor transistor having a first end of a channel connected to said reference voltage output terminal and a second end of said channel and a gate commonly connected to each other, said metal oxide semiconductor transistor having a resistance varying inversely with said internal reference voltage, said divided voltage being provided to a second input terminal of said differential amplifier.

8. A reference voltage generator as claimed in claim 7, further comprised of said metal oxide semiconductor transistor being operated in a saturation region.

9. A reference voltage generator as claimed in claim 7, wherein said output reference voltage is greater than and proportional to said internal reference voltage, and said output reference voltage is inversely proportional to said resistance.

10. A reference voltage generator as claimed in claim 7, further comprising a drive PMOS transistor having a gate receiving a differential signal generated by said differential amplifier and having a channel connected between said reference voltage output terminal and a power supply terminal.

11. A reference voltage generator as claimed in claim 7, further comprising a resistor being connected between said second end of said channel of said metal oxide semiconductor transistor and a ground voltage terminal, said resistor comprising a diffusion region in a semiconductor substrate.

12. A reference voltage generator as claimed in claim 7, further comprising a resistor being connected between said second end of said channel of said metal oxide semiconductor transistor and a ground voltage terminal, said resistor being comprised of polycrystalline silicon.

13. A reference voltage generator as claimed in claim 1, wherein said resistive means comprises a diffusion region formed in a semiconductor substrate.

14. A reference voltage generator as claimed in claim 1, wherein said resistive means comprises polycrystalline silicon having a thickness between 4000 Å and 6000 Å.

15. A reference voltage generator as claimed in claim 1, wherein said first voltage is a supply voltage.

16. A reference voltage generator as claimed in claim 1, wherein said second voltage is a ground voltage.

17. A reference voltage generator as claimed in claim 3, wherein said second MOS transistor is diode connected P-MOS transistor.

18. A reference voltage generator for use in a semiconductor memory device, said reference voltage generator comprising:

a reference voltage circuit for producing an internal reference voltage varying as a function of temperature;

differential amplifier means for generating difference signals based upon said internal reference voltage and a divided voltage;

a first MOS transistor having a first gate receiving said difference signals and having a first channel connected between a supply voltage terminal and a reference voltage output terminal;

voltage dividing means for generating said divided voltage at a voltage divider output terminal, said voltage dividing means comprising MOS-type load means cascade connected with a first resistor between said reference voltage output terminal and a ground voltage terminal, said voltage divider output terminal being at a junction between said MOS-type load means and said first resistor, said MOS-type load means being operated in a saturation region.

19. A reference voltage generator as claimed in claim 18, wherein said reference voltage circuit comprises:

a resistor connected between said supply voltage terminal and an internal reference voltage terminal providing said internal reference voltage; and a plurality of series connected MOS transistors connected between said ground voltage terminal and said internal reference voltage terminal, each one of said series connected MOS transistors being diode connected.

20. A reference voltage generator as claimed in claim 19, wherein said series connected MOS transistors are each P-MOS transistors.

21. A reference voltage generator as claimed in claim 19, wherein said reference voltage circuit comprises:

a resistor cascade connected with a plurality of series connected MOS transistors between said supply voltage terminal and said ground voltage terminal, said internal reference voltage being provided at a junction between said resistor and said plurality of series connected MOS transistors.

22. A reference voltage generator as claimed in claim 18, wherein said MOS-type load means is a diode-connected P-MOS transistor having a channel connected between said reference voltage output terminal and said voltage divider output terminal.

23. A reference voltage generator as claimed in claim 18, wherein said voltage dividing means further comprises a second resistor and said MOS-type load means is a diode-connected P-MOS transistor, said second resistor being series connected with said diode-connected P-MOS transistor between said reference voltage output terminal and said voltage divider output terminal, said first resistor being connected between said voltage divider output terminal and said ground voltage terminal.

* * * * *